United States Patent
Shen et al.

(10) Patent No.: US 7,927,922 B2
(45) Date of Patent: *Apr. 19, 2011

(54) DICE REARRANGEMENT PACKAGE STRUCTURE USING LAYOUT PROCESS TO FORM A COMPLIANT CONFIGURATION

(75) Inventors: Geng-Shin Shen, Hsinchu (TW); Yu-Ren Chen, Hsinchu (TW)

(73) Assignees: Chipmos Technologies Inc, Hsinchu County (TW); Chipmos Technologies (Bermuda) Ltd, Hamilton (BM)

( * ) Notice: Subject to any disclaimer, the term of this patent is extended or adjusted under 35 U.S.C. 154(b) by 271 days.

This patent is subject to a terminal disclaimer.

(21) Appl. No.: 12/191,382

(22) Filed: Aug. 14, 2008

(65) Prior Publication Data

US 2009/0160043 A1    Jun. 25, 2009

(30) Foreign Application Priority Data

Dec. 20, 2007  (TW) ................................ 96149046 A

(51) Int. Cl.
H01L 21/44 (2006.01)
H01L 21/48 (2006.01)
H01L 21/50 (2006.01)

(52) U.S. Cl. ........................................ 438/114; 438/124
(58) Field of Classification Search .................. 438/114, 438/124; 257/23.01, 21.502
See application file for complete search history.

(56) References Cited

U.S. PATENT DOCUMENTS

| | | | |
|---|---|---|---|
| 5,879,964 A | 3/1999 | Paik et al. | |
| 6,103,554 A | 8/2000 | Son et al. | |
| 6,825,553 B2 | 11/2004 | Chua et al. | |
| 6,830,958 B2 | 12/2004 | Makimoto | |
| 6,858,799 B2 | 2/2005 | Hedler et al. | |
| 6,867,471 B2 | 3/2005 | Goller et al. | |
| 6,867,479 B2 | 3/2005 | Hubner | |
| 6,873,060 B2 | 3/2005 | Blaszczak et al. | |
| 6,897,096 B2 | 5/2005 | Cobbley et al. | |
| 6,905,891 B2 | 6/2005 | Kovar et al. | |
| 6,919,232 B2 | 7/2005 | Hedler et al. | |
| 6,964,881 B2 | 11/2005 | Chua et al. | |
| 6,965,160 B2 | 11/2005 | Cobbley et al. | |
| 7,002,245 B2 | 2/2006 | Huang et al. | |
| 7,011,989 B2 | 3/2006 | Becker et al. | |
| 7,037,761 B2 | 5/2006 | Hedler et al. | |
| 7,061,123 B1 | 6/2006 | Chee et al. | |
| 7,074,696 B1 | 7/2006 | Frankowsky et al. | |
| 7,087,992 B2 | 8/2006 | Chua et al. | |
| 7,091,595 B2 | 8/2006 | Fuergut et al. | |
| 7,163,843 B2 | 1/2007 | Kiendl et al. | |
| 7,196,408 B2 | 3/2007 | Yang et al. | |
| 7,202,107 B2 | 4/2007 | Fuergut et al. | |
| 7,223,320 B2 | 5/2007 | Arneson et al. | |
| 7,223,639 B2 | 5/2007 | Blaszczak et al. | |
| 7,238,602 B2 | 7/2007 | Yang | |
| 7,662,667 B2 * | 2/2010 | Shen | 438/112 |

* cited by examiner

Primary Examiner — William M. Brewster
(74) Attorney, Agent, or Firm — Ming Chow; Sinorica, LLC

(57) ABSTRACT

A dice rearrangement package structure is provided, which a dice having an active surface and a bottom surface, and a plurality of pads is disposed on the active surface; a package body is provided to cover the dices and the plurality of pads being exposed; one ends of plurality of metal traces is electrically connected to the each pads; a protection layer is provided to cover the active surface and the other ends of the exposed metal traces is electrically connected to the plurality of conductive elements, the characteristic in that the package body is a B-stage material.

36 Claims, 13 Drawing Sheets

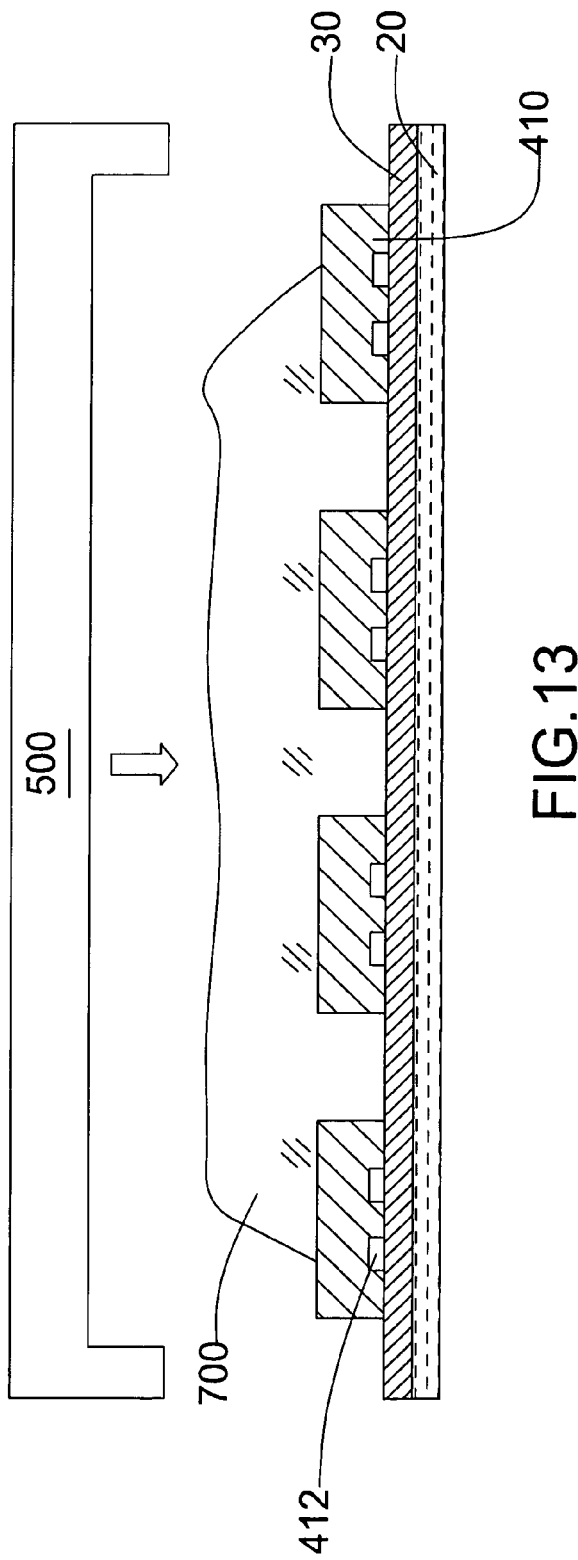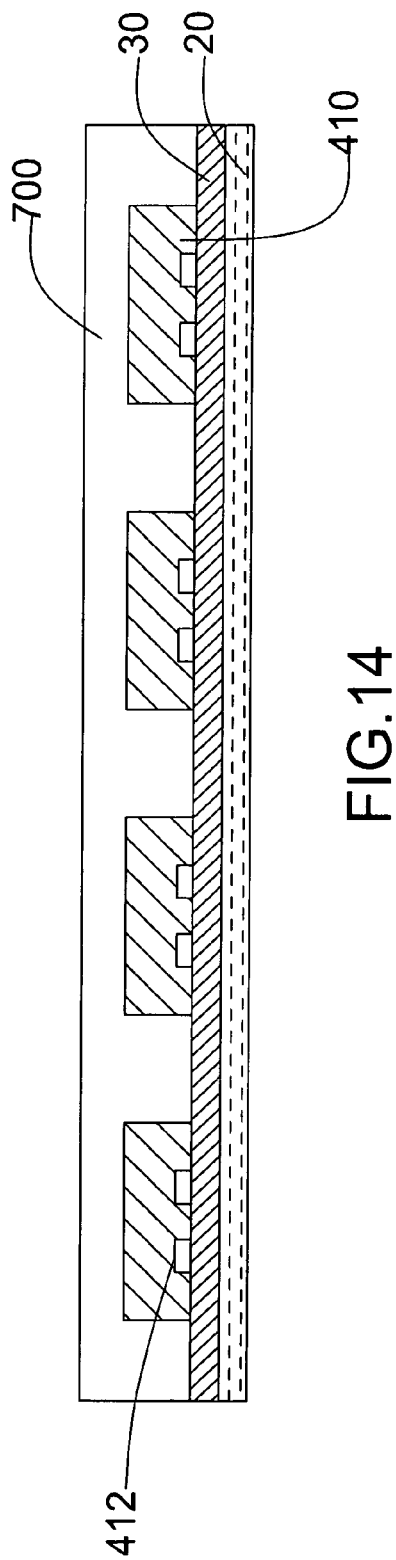

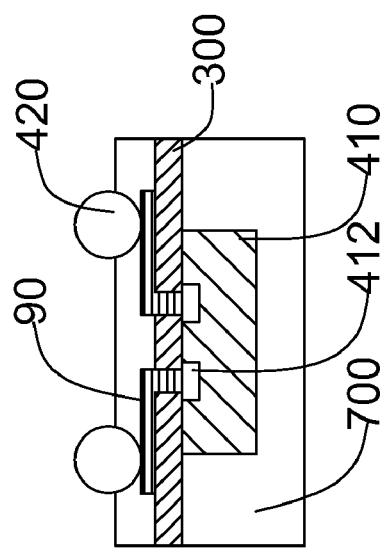
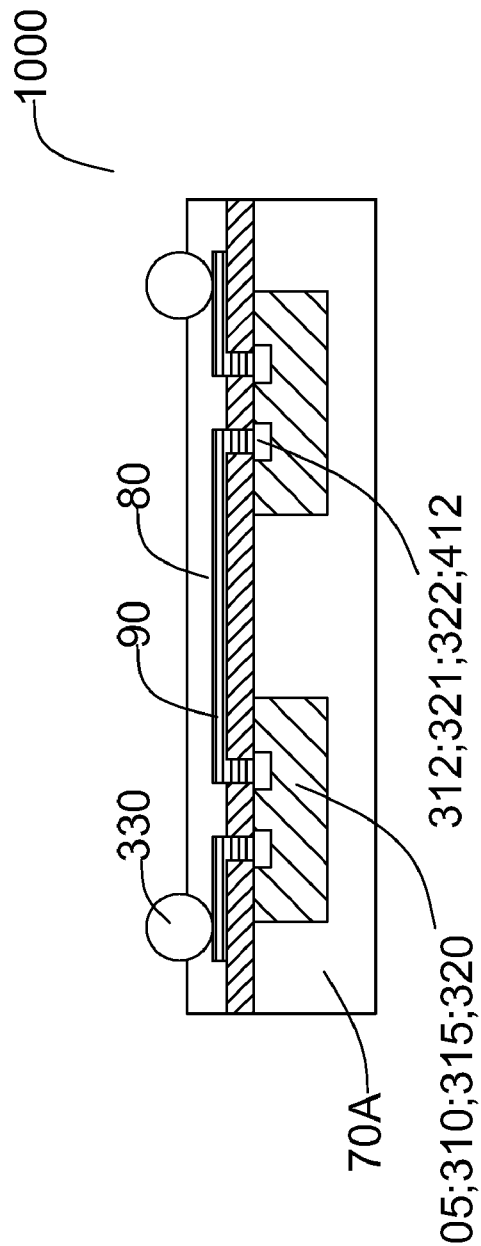
FIG.19
FIG.20

DICE REARRANGEMENT PACKAGE STRUCTURE USING LAYOUT PROCESS TO FORM A COMPLIANT CONFIGURATION

BACKGROUND OF THE INVENTION

1. Field of the Invention

The present invention is related to a packaging method of semiconductor, more particularly, to a packaging method and a structure of dices rearrangement by a redistribution layer process to form a module with packaged body.

2. Description of the Prior Art

Miniaturized semiconductor dice has been a trend for its various functions. These semiconductor dices should be provided with more and more I/O pads within a smaller region, so the density of metal pins raises. Thus, the package technology of lead frame has been replaced by the technology of ball grid array (BGA). It is advantageous for BGA to provide more compact density and have solder less subject to damage and distorted.

With 3C products in fashion, such as cell phone, PDA or iPod, these 3C products are equipped with at least one systemic chip within a smaller volume. A wafer level package (WLP) has been developed to packaging a wafer before sawing. U.S. Pat. No. 5,323,051 discloses one kind of wafer level package. However, for WLP, the increasing number and the reduced pitches of the bonding pads result in signal coupling and noise. In addition, the reliability of package may be reduced because of the reduced pitches. Thus, WLP aforementioned may not satisfy the design of smaller dices.

For resolving the issue, U.S. Pat. No. 7,196,408 teaches a method for the semiconductor process. A plurality of good dices is after tested and sawed rearranged on another substrate for the sequential packaging process. Those rearranged dices have wider pitches for the suitable distribution of bonding pads on the dices, such as using fan out technology. Such a method may resolve the issues of signal coupling and noise caused by small pitches.

However, for the semiconductor chip with smaller and thinner packaging structure, before the wafer saw, the wafer may be processed by a thinning process, such as thinning the wafer in the thickness of 2 to 20 mil by backside lapping. Then the wafer is sawed to become dice units. Those thinned dices are rearranged on another substrate. Then, a molding process is applied on those thinned dices to form a molding structure. Because both the dices and the molding structure are thin very much, the stress from the molding structure itself would cause curl after the substrate is separated from the molding structure. The curl of the molding structure may make a sequential saw process difficult.

Accordingly, the present invention provides a packaging method for dices rearrangement to efficiently resolve the issue of curl on a molding package.

SUMMARY OF THE INVENTION

According to the problems described above, the object of the present invention is to provide a dice rearrangement package structure with the alignment mark and the package method package structure. Thus, the main object of the present invention is to provide a B-stage material to encapsulate the dice to increase the yield and the reliability.

Another object of the present invention is to provide the packaging method for dices rearrangement. The dices derived from a 12-inches wafer are rearranged on the substrate of an 8-inches wafer. The packaging equipments for the 8-inches wafer may be utilized to reduce the packaging cost.

Another object of the present invention is to provide the packaging method of dices rearrangement. All of dices packaged are known good ones to reduce the packaging and manufacturing costs.

According to above package structure, the present invention provides a dice rearrangement package method, which includes providing a first substrate having a top surface and a bottom surface, and a layer of sensitive material disposed on the top surface of the first substrate; providing a plurality of dices, each plurality of dices having an active surface and a reverse side, and a plurality of pads is disposed on the active surface of the dices; picking and placing the plurality of dices is flipped on the layer of sensitive material; providing a second substrate having a top surface and a bottom surface, and a layer of polymer material is disposed on the top surface of the second substrate; forming an encapsulated body to assembly the second substrate and the layer of polymer material with the top surface of the first substrate, so as to the layer of polymer material encapsulated the each dices and filled between the dices; separating the first substrate to expose the sensitive material; forming a plurality of openings within the sensitive material and the plurality of pads is to be exposed; forming a plurality of fan-out metal traces, and one ends of each plurality of metal traces is electrically connected the plurality of pads; forming a protective layer to encapsulate the active surface of the each dices and to expose the other ends of the plurality of metal traces; and cutting the encapsulated body to form a plurality of package body independently.

The present invention also provides another dice rearrangement package structure, which includes a dice having an active surface and a bottom surface, and the plurality of pads is on the active surface; an encapsulated body encapsulated the dice and exposed the plurality of pads; one ends of a plurality of fan-out metal traces electrically connected the each plurality of pads; a protective layer encapsulated the active surface of the dice and exposed the other ends of the metal traces; and a plurality of connecting components electrically connected the other ends of the plurality of metal traces, the characteristic in that: the encapsulated body is B-stage material.

The present invention still provides a dice rearrangement package structure, which includes a plurality of dices having an active surface and a bottom surface, and a plurality of pads on the active surface; an encapsulated body encapsulated the plurality of dices and exposed the pads on the active surface; one ends of a plurality of fan-out metal traces electrically connected the plurality of pads; a protective layer encapsulated the active surface of dice and exposed the other ends of the metal traces; and a plurality of connecting components electrically connected the other ends of the metal traces, the characteristic in that the encapsulated body is B-stage material.

BRIEF DESCRIPTION OF THE DRAWINGS

FIG. 13 to FIG. 19 shows the cross-sectional view of another embodiment of the package structure according to the present invention; and FIG. 20 shows a cross-sectional view of the still embodiment of the package structure according to the present invention.

DESCRIPTION OF THE PREFERRED EMBODIMENT

The present invention provides a packaging method for dices rearrangement to re-dispose dices on another substrate for packaging. Following illustrations describe detailed the process or steps for understanding the present invention. Obviously, the present invention is not limited to the embodiments of a stacked structure; however, the preferred embodiments of the present invention are illustrated as followings. Besides, the present invention may be applied to other embodiments, not limited to ones mentioned.

Figure 1:
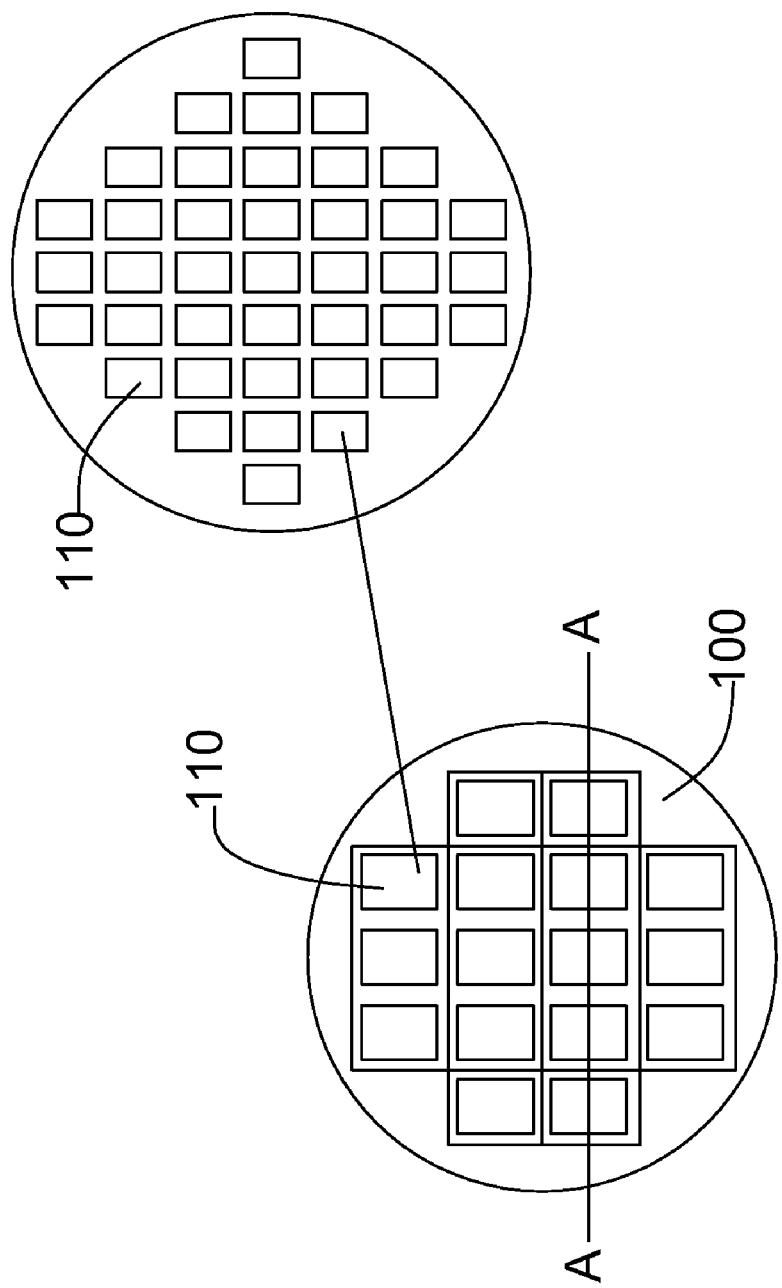
FIG. 1 shows a prior art of the package structure.

In modern semiconductor packaging process, a wafer which has been implemented by a front end process is done by a thinning process in thickness about 2 to 20 mil. A sawing process is applied on the wafer to form a plurality of dice 110 units. Then, these dices 110 are transferred from a pick and place to another substrate 100. Shown in FIG. 1, it is obvious that there are wider pitches among the dices 110 on the substrate 100 than the ones before sawing. Thus, these rearranged dices 100 have wider pitches for the deposition of bonding pads. Moreover, the dices saw from the 12-inches wafer may be rearranged on an 8-inches wafer and implemented by conventional package equipments for 8-inches wafers without setting new equipments for 12-inches wafers. It is noted that the present invention is not limited to 8-inches wafers. Any substrate which may support dices and be in any shape, such as glass, quartz, ceramic, PCB or metal foil, is utilized for the substrate 100 in the present invention.

Figure 2:
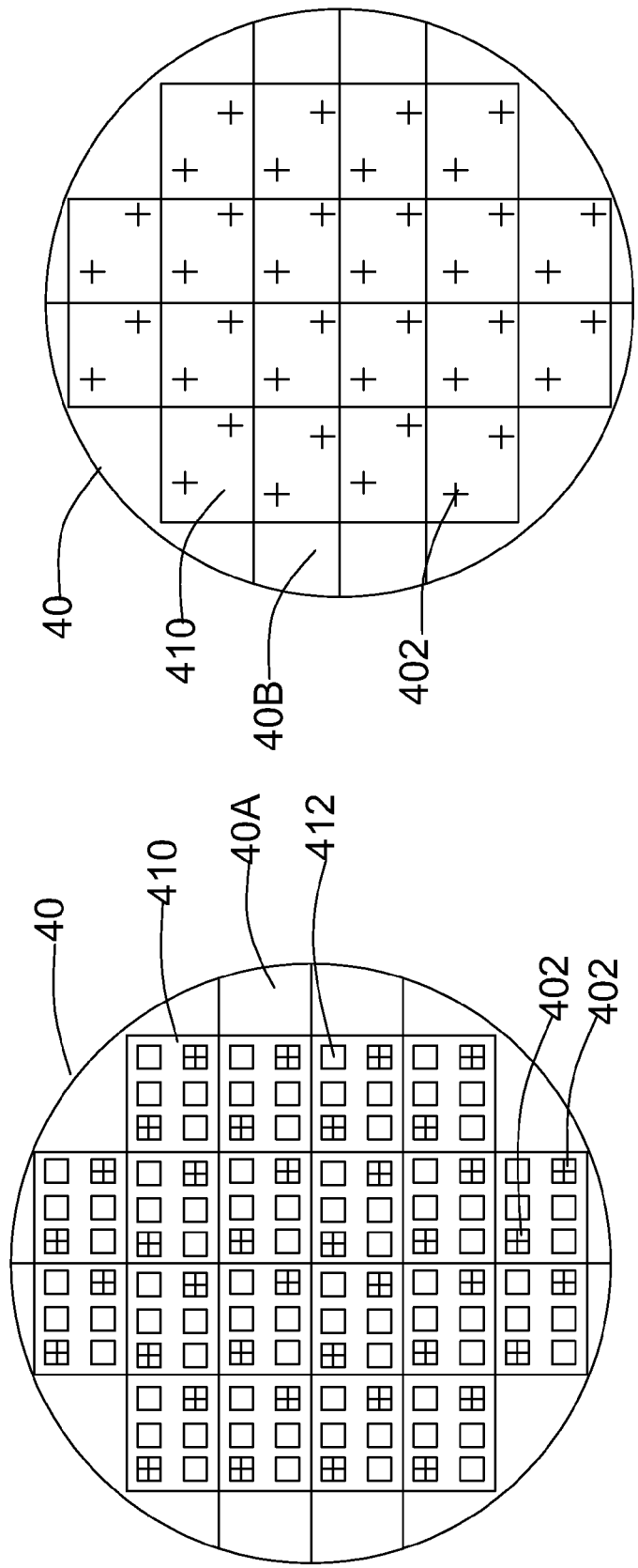
FIG. 2A to FIG. 2B show the alignment mark on the reverse side of the wafer according to the present invention.

Firstly, FIG. 2A and FIG. 2B show the vertical view of the wafer having the alignment mark. As shown in FIG. 2A, the top surface 40A of the wafer 40 having a plurality of dices 410, and the plurality of alignment mark 402 is disposed on the x-y direction of the reverse side 40B of each dices 410, as shown in FIG. 2B. According to above described the plurality of dices 410 is formed by cutting wafer 40, and transferred from a pick and place to another substrate 100. Due to the pitches among these dices on the new substrate 100 is wider than the dice 410. Thus, these dices 410 are transferred from pick and place to the new substrate 100 that would be introduced the mis-alignment. Due to the ball mounted process also would not be aligned in subsequently process, and the reliability of the package structure would be decreased. Therefore, in this embodiment, before sawing process is performed, the reverse side of wafer 40 is turned upward, and the plurality of alignment marks 402 is formed in the x-y direction on the reverse side of each dices 410. Then, each dices 410 is transferred from pick and place to the substrate 100 by pick and place apparatus (not shown in Figure). Because the alignment mark 402 is formed on the reverse side of each dices 410, so that the pick and place apparatus can discriminate the position for the pads of each dices 410 to place the dices on the substrate 100 directly. The dice 410 did not overturn to place on the substrate 100 so that the pick and placing apparatus can determine the reference point of the substrate 100 that corresponding position of the dice 410 when the dice 410 is disposed on the substrate 100. Herein, the formation of alignment mark is formed by photo-etching process, in which the plurality of alignment mark 402 is formed on the reverse side 40B of the wafer 40, and the shape of the alignment mark 402 can be geometric shape. In another embodiment, the geometric shape is a crisscross-type. On the other hand, the formation of the alignment mark 402 also includes laser marks process.

Figure 3:
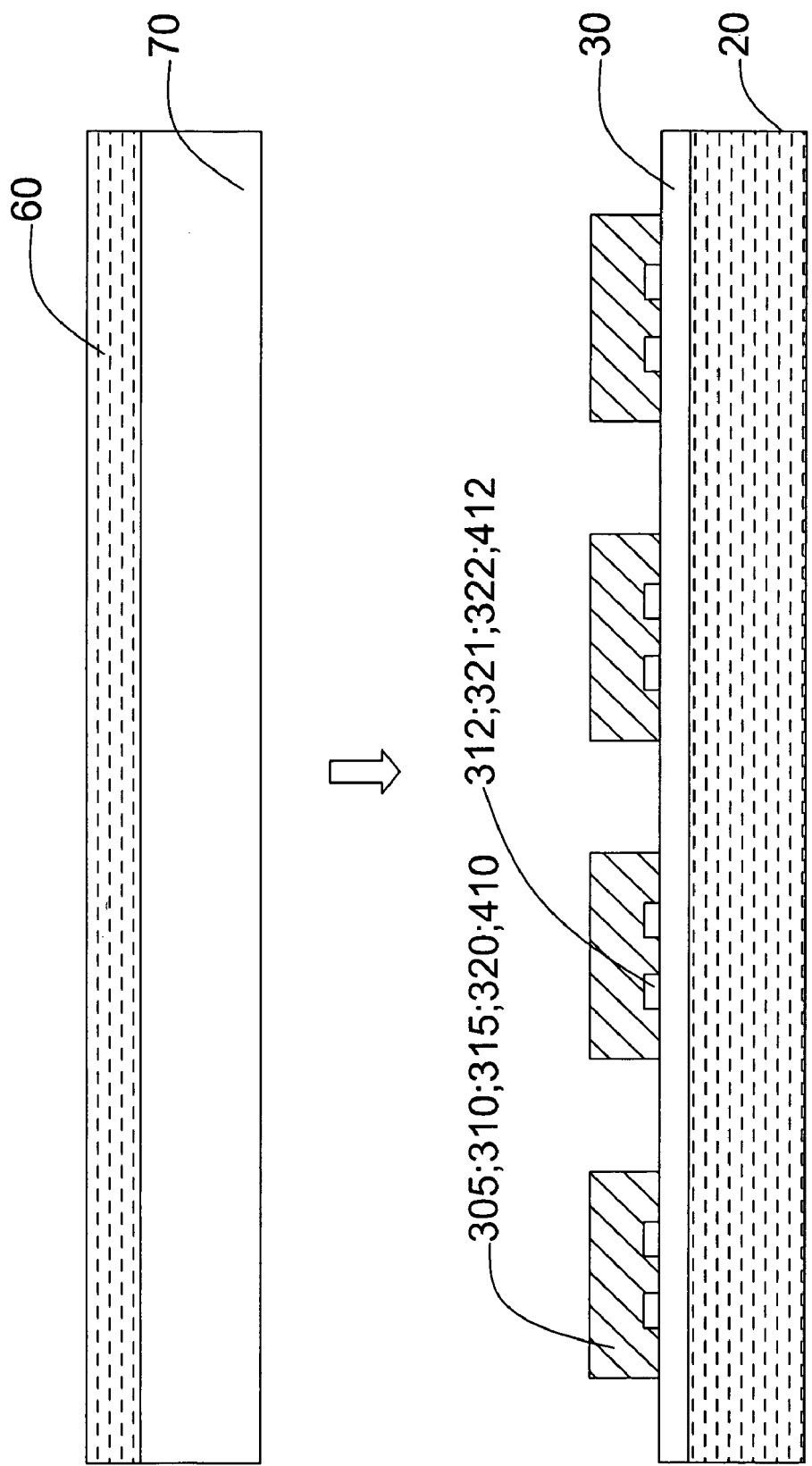
FIG. 3 to FIG. 7 shows the cross-sectional view of the one embodiment of the package structure according to the present invention.

Referring to FIG. 3 shows a cross-sectional of the embodiment of this invention. As shown in FIG. 3, a layer of polymer material 30 is disposed on the substrate 20, the material of layer of polymer material such as silicon rubber, silicon resin, elastic PU, porous PU, acrylic rubber, or dice cutting rubber. Next, the pick and place apparatus (not shown in Figure) transferred the dices 410 from pick and place to the layer of polymer material 30 on the substrate 20, in which the pads of the dice 410 is attached to the layer of polymer material 30 on the substrate 20. Then, the B-stage material is formed on another substrate 60. Similarly, the material of substrate 60 such as glass, quartz, ceramic, PCB or metal foil, it is not limited in this embodiment. Thereafter, the pre-baking process is alternatively process to perform in this embodiment, for example, the B-stage material 70 is baked in an environment at temperature is range of 80° C. to 100° C. and the duration is 5 to 10 minutes, so that the B-stage material with liquid state is transformed into an adhesive layer with viscosity state and assembled with substrate 60. It is should be noted that the thickness of the layer of B-stage material 70 is larger than the thickness of each dices 410, the thickness of the layer of B-stage material 70 is 3 to 20 mil. Next, the layer of B-stage material 70 and the substrate 60 is overturned upward, so that the layer of B-stage material 70 is toward to the reverse side of each dices 410 on the substrate 20 as shown in FIG. 3.

Figure 4:
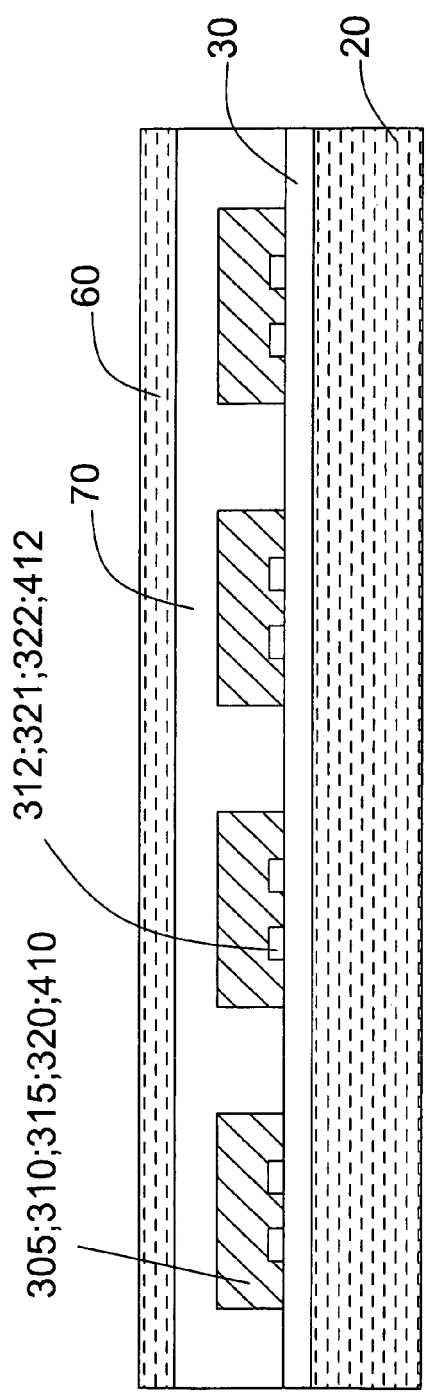

Then, the substrate 60 and the layer B-stage material 70 is pressed downward, so that the each dices 410 is encapsulated by the layer of B-stage material 70 as shown in FIG. 4. Next, the layer of B-stage material 70 is cured to form an encapsulated body 70A by a baking process, in which the baking process is performed in an environment at temperature is about 120° C. to 250° C. and duration is about 20 to 60 minutes. Then, the substrate 60 is separated from the encapsulated body 70A to expose the surface of the encapsulated body 70A. Then, the surface of encapsulated body 70A is sawing to form a plurality of sawing lines 414 by cutter (not shown in Figure), in which the depth of each sawing lines 414 is about 0.5 mils to 1 mils and the width is about 5 to 25 micrometers. In a preferred embodiment, the sawing line 414 can be perpendicular each other, and also can be a reference line for sawing the dices actually.

Then, the layer of polymer material 30 is separated from the encapsulated body 70A, for example, the layer of polymer material 30 and the substrate are disposed in a tank (not shown in Figure) with de-ion water, so that the layer of polymer material 30 is separated from the encapsulated body 70A. It is obviously that the encapsulated body 70A encapsulated the each dices 410 and the pads 412 of each dices 410 are to be exposed. The strain of the encapsulated body 70A would be counterbalanced via the area is form be the plurality of sawing lines 414 on the surface of the encapsulated body 70A, therefore, the warpage of the encapsulated body 70A can be solved after the layer of polymer material 30 is separated from the encapsulated body 70A.

Figure 5:
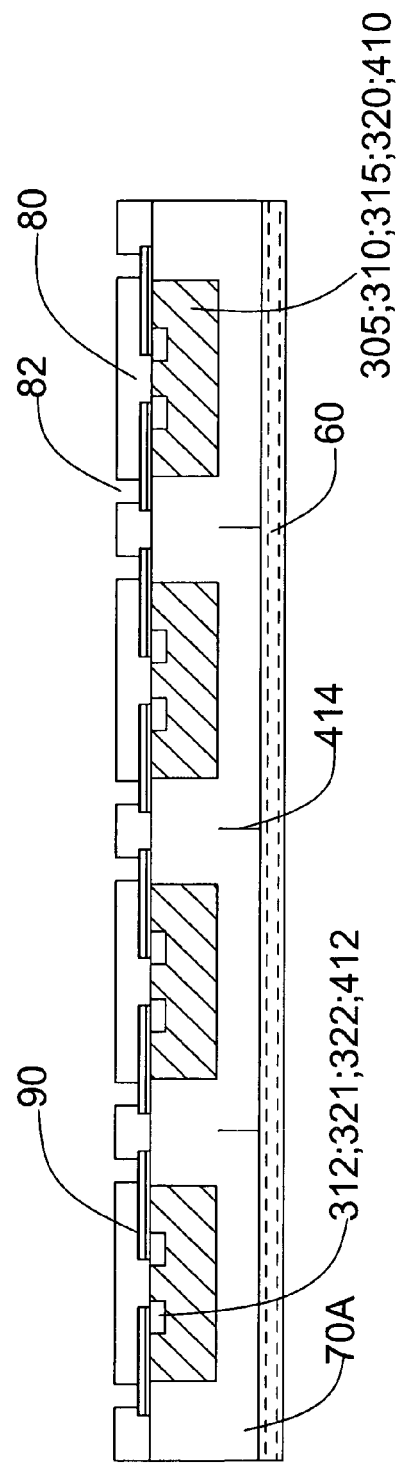
Figure 6:
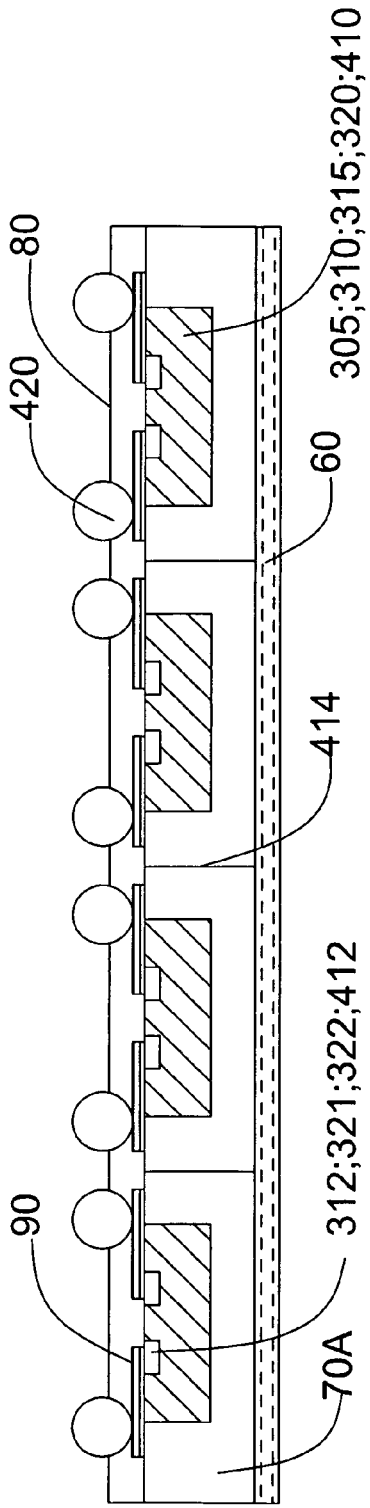

Next, a plurality of fan-out metal traces 90 is formed by redistribution layer (RDL) process, in which one ends of metal traces 90 is electrically connected each pads 412 on the active surface of the dice 410 and another ends of the metal traces 90 is extend toward the dice 410. Then, a protective layer 80 is formed on the metal traces 90 by semiconductor process, and a plurality of openings 80 is formed on the other ends of each metal traces 90 as shown in FIG. 5. Finally, a plurality of connecting components 420 is formed on each opening 82 so that the connecting components 42 used as connecting points for the dices 410. The connecting components 420 can be metal bump or solder ball, as shown in FIG. 6. Next, the encapsulated body 70A is cut to form a plurality of dice package structure. It is obviously, the five surface of each dices 410 is encapsulated by encapsulated body 70 is formed from the B-stage material 70. Similarly, the metal traces 90 and the connecting components 420 can electrically connect the pads 412 of dices 410 accurately, and the reliability of the dice 410 can be increased.

In above embodiments, the layer of polymer material 30 can be replaced with photosensitive layer. The B-stage material 70 is cured to form the encapsulated body 70A to encapsulate the plurality of dices 410 that combined with the photo sensitive layer 30, and the photo sensitive layer 30 is also cured. Thus, the photo sensitive layer 30 is drawn deep into the de-ionic water, and the photo sensitive layer 30 would be separated from the encapsulated body 70A to expose the pads 412 of each dices 410. Then, the plurality of fan-out metal traces 90 is formed by redistribution layer process, one ends of the metal traces 90 is electrically connected the each pads 412 on the active surface of the dices 410, and another ends of metal traces 90 is extended toward the peripheral of the dices 410. Next, a protective layer 80 is formed on the metal traces 90 via semiconductor process, and the plurality of openings 82 is formed on the other ends of each metal traces 90 as shown in FIG. 5. Finally, a plurality of connecting components 420 is formed on each openings 82 that used as the connecting point for the dices 410, in which the connecting components 420 can be metal bump or solder ball as shown in FIG. 6. Then, the encapsulated body 70A is cut to form a plurality of dices with package body as shown in FIG. 7.

Figure 7:
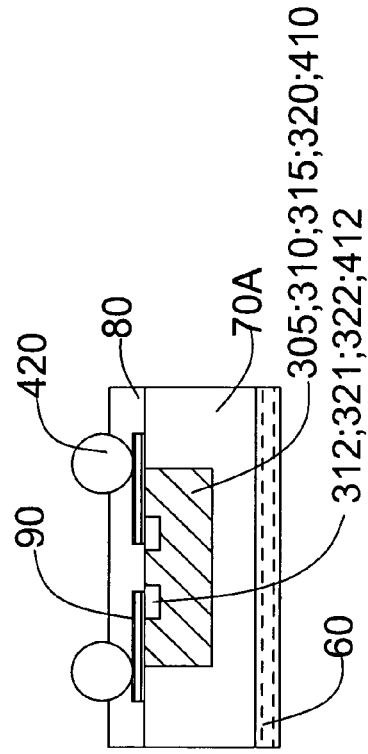

Otherwise, in above embodiment, the substrate 60 is retained to form on the reverse side of the each dices 410 with package body, thus, the substrate can be a heat dissipation device for the dice 410 with package body as shown in FIG. 7. In above mentioned, the substrate 60 is separated from the encapsulated body 70A when the layer of polymer material 30 is separated from the encapsulated body 70A so that the reverse side of dice 410 with package body without substrate 60.

Figure 8:
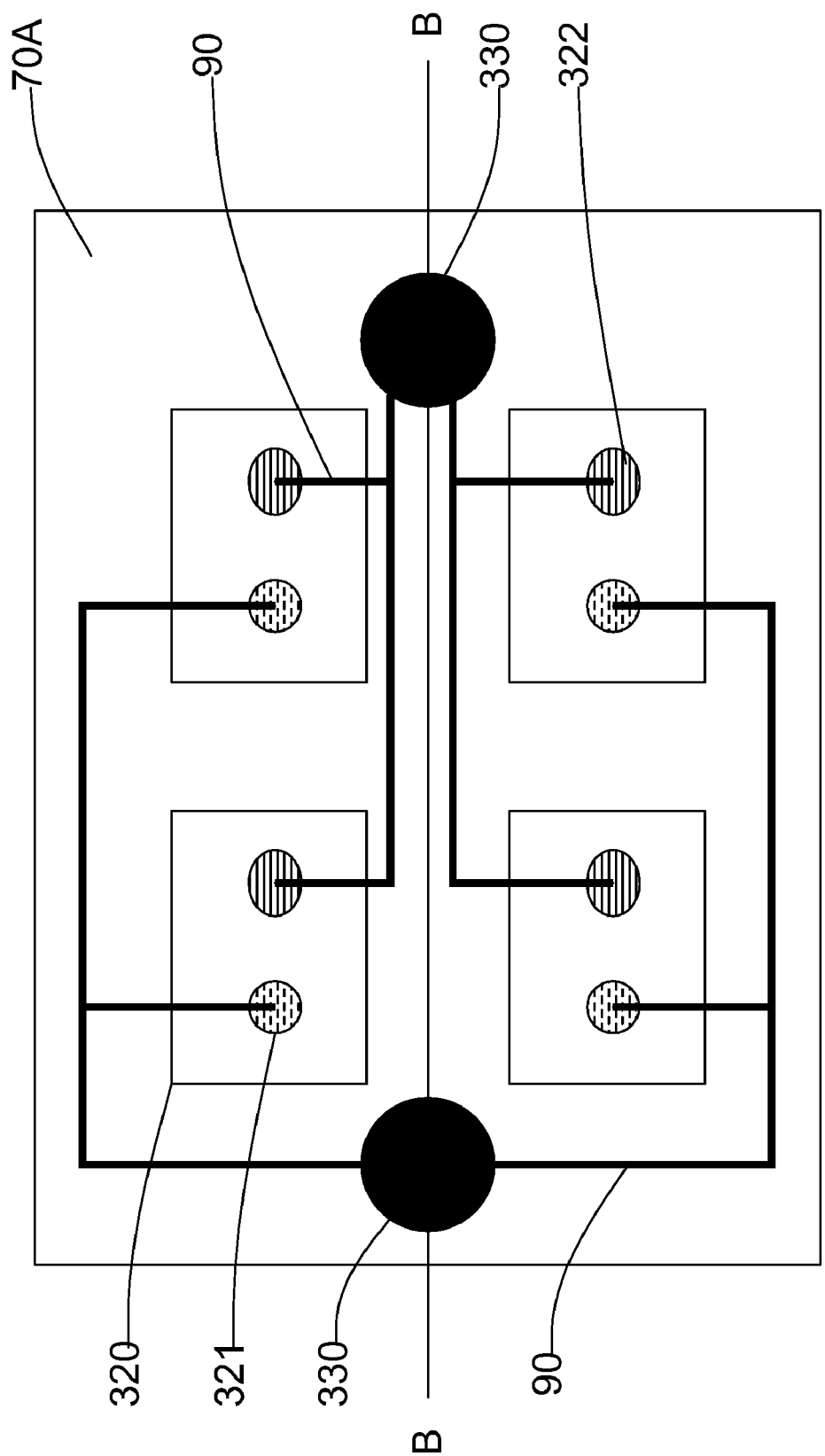
FIG. 8 to FIG. 12 shows the cross-sectional view of the module with package body according to the present invention.

According to above mentioned, the present invention also provide a module for multi-chip package body. Referring to FIG. 8 shows a plurality of dices with same dimensions that formed a package module. In this embodiment, the module for a plurality of dices with same dimensions can be four light emitting devices (LEDs) or four dynamic random access memories (DRAMs).

As shown in FIG. 8, the dice 320 is a LED, the P electrode 322 of LED 320 is electrically connected to the P electrode 322 of another adjacent LED 320, and the N electrode of LED 320 is electrically connected to the N electrode 322 of another adjacent LED 320. The N electrode 321 and P electrode 322 of each LEDs 320 are electrically connected the connecting components 330 via metal traces 90. The number of LEDs and connecting method are not limited in this invention, for example, the plurality of LEDs is formed in serial connection to produce a pillar-type light source, or formed in parallel connection to produce a plane-type light source, herein the color of LEDs can be red LED, green LED, blue LED or other color LED such as white LED, or the above combination. Otherwise, when the dice is DRAM, the pads of each DRAM is identical, thus, the patterned metal traces can be layout to electrically connect the each DRAMs. For example, the four 256 MB DRAM are packaged in a serial connection or in a parallel connection to form a 1 G MB memory module. It is noted that the patterned metal trace used to electrically the dice that is not a key point of this invention, thus, the invention would not described as following.

Figure 9:
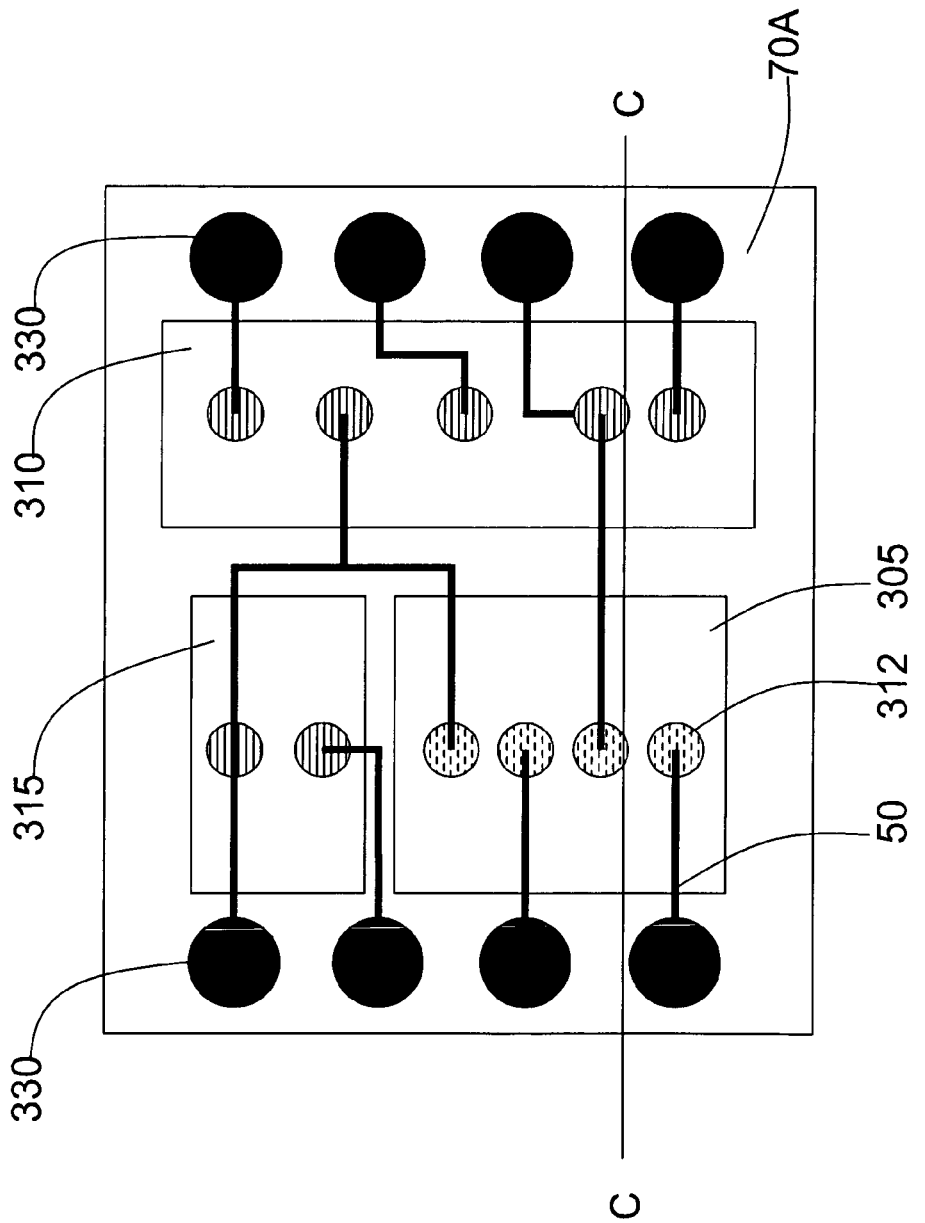

Furthermore, the present invention also provides a plurality of dices with different dimensions to form a package module as shown in FIG. 9. It is obviously, the plurality of dices with different dimensions to form a SIP module (system-in-package). In this embodiment, these dices can be microprocessor means, memory means or memory controller means, in which the active surface of each dices having a plurality of pads, and a plurality of patterned metal traces is formed in serial connection or parallel connection on each pads of the dices to connect the adjacent dice, and electrically connected the connecting components. The package process for the plurality of dices with different dimensions is similarly to the above FIG. 3 to FIG. 5, thus, the description as following.

Firstly, as shown in FIG. 3, a substrate 20 is provided and a layer of polymer material 30 is formed on the substrate 20, in which the layer of polymer material 30 is adhesive material with elastic, such as silicon rubber, silicon resin, elastic PU, porous PU, acrylic rubber, or dice cutter. Then, the reverse side of the dices (305, 310, 315, and 320) having a plurality of alignment marks 402 is picked upward and transferred to place to the layer of polymer material 30 on the substrate 20, in which the pads (312, 321, 322) is connected on the layer of polymer material 30 on the substrate 20. Next, a B-stage material 70 is formed on the substrate 60, in which the substrate 60 can be glass, quartz, ceramic, circuit board or metal foil. Then, it is an alternatively process, a pre-baking process is performed to the B-stage material 70 to form a B-stage material with viscosity state and combined with the substrate 60, herein, the temperature of baking process is about 80° C. to 100° C. and the duration is about 5 to 10 minutes. It is noted that the thickness of the B-stage material 70 is greater than the thickness of dices (305, 310, 315, and 320), such as 3 to 20 mils. Thereafter, the substrate 60 and the B-stage material 70 are overturned and the B-stage material 70 is toward the reverse side of the each dice on the substrate 20 as shown in FIG. 3. Next, the substrate 60 and the B-stage material 70 are pressed downward to encapsulate the each dice (305, 310, 315, 320), as shown in FIG. 4. Then, a baking process is performed to cure the B-stage material 70 to form an encapsulated body 70A, in which the temperature of baking process is about 120° C. to 250° C. and the duration is about 20 to 60 minutes. Next, the substrate 60 is separated from the encapsulated body 70A to expose the surface of the encapsulated body 70A. Thereafter, the surface of encapsulated body 70A is cut to form a plurality of sawing lines 414 by cutter (not shown in Figure). Next, the layer of polymer material 30 and the substrate 20 are placed in a tank with de-ionic water, s that the layer of polymer material 30 is separated from the encapsulated body 70A. It is obviously, each dice (305, 310, 315, and 320) are encapsulated by encapsulated body 70A and expose the pads (312, 321, and 322) of the each dice (305, 310, 315, and 320). Due to there are plurality of sawing lines 414 on the surface of the encapsulated body 70A, thus, the stress of the encapsulated body 70A will counterbalance to solve the warpage of the encapsulated body 70A when the encapsulated body 70A is separated from the layer of polymer material 30.

Figure 10:
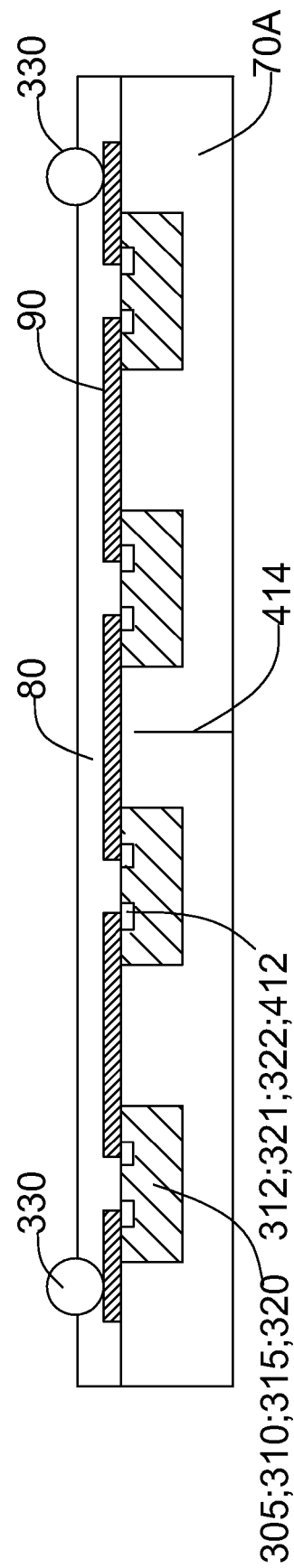

Next, referring to FIG. 10 shows the BB line of the FIG. 8 and CC line of FIG. 9. As shown in FIG. 10, the plurality of fan-out metal traces 90 is formed by redistribution layer process, the one ends of metal traces 90 is electrically connected each pads (312, 321, and 322) of the dices, and another ends of the metal traces 90 is extended toward the peripheral of dices (305, 310, 315, and 320). For example, the plurality of patterned metal traces is formed on the exposed active surface of dices, and one ends of the patterned metal traces 90 is electrically connected the each P electrode 321 and N electrode 322 on the active surface of each LEDs 320 respectively, and another ends of the metal traces 90 are commonly electrically connected the extended of metal traces 90.

Then, a protective layer 80 (such as polyimide) is formed on the metal traces 90 by semiconductor process to cover the plurality of patterned metal traces 90, and a plurality of opening 80 is formed on the other ends of the metal traces 90 (as shown in FIG. 5). Finally, the plurality of connecting components 330 is formed on the each openings 80 that used as the connecting point for the dices (305, 310, 315, and 320), in which the connecting components 330 is metal bump or solder ball as shown in FIG. 10. Next, the encapsulated body 70A is cut to form a plurality of packaged module. It is obviously, the five surfaces of each dices (305, 310, 315, and 320) within the each module 1000 are encapsulated by encapsulated body 70A, and the active surface of the dices (305, 310, 315, and 320) is encapsulated by the layer of B-stage material 70. Meanwhile, the metal traces 90 and the connecting components 330 can connect with the pads (312, 321, and 322) according to the alignment mark 402 on the reverse side of each dice (305, 310, 315, and 320) so that the reliability of packaged module is increased. In above embodiment, the layer of polymer material 30 on the substrate 20 can be replaced with a photo sensitive layer. Due to the formation process as the above mentioned, thus it would not be described herein.

Figure 12:
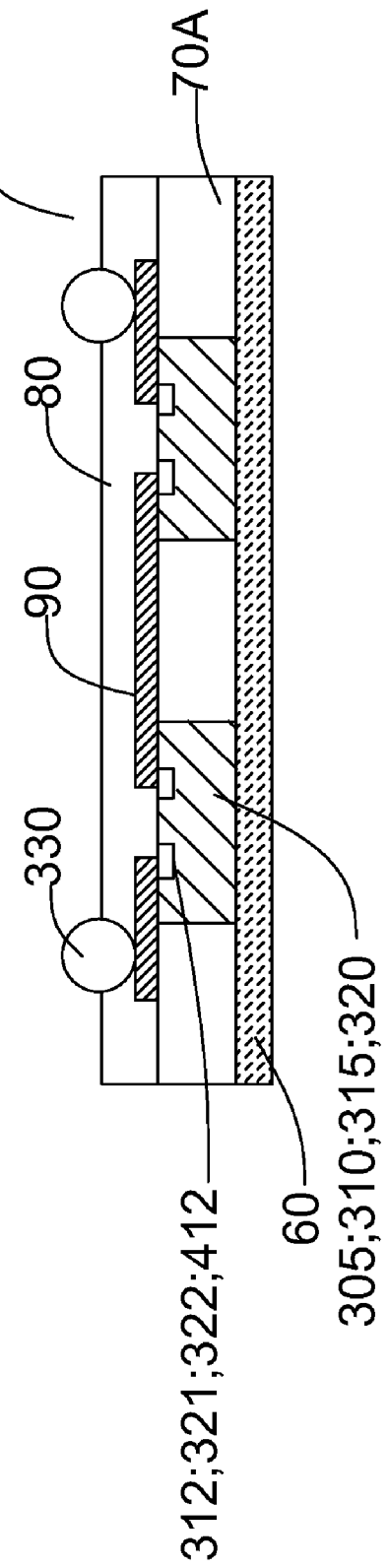

In another embodiment of this invention, the heat dissipation 60 is formed on the reverse side of encapsulated body as shown in FIG. 12. The formation is that the substrate 60 is not removed to use as the heat dissipation. Otherwise, the reverse side of dice can be exposed by the thinning process and heat dissipation is attached to the exposed reverse side of the dices as shown in FIG. 12.

Referring to FIG. 13, a photo sensitive layer 30 is formed on the substrate 20. Then, the plurality of dices 410 is transferred from pick and place to the photo sensitive layer 30 on the substrate 20 by pick and place apparatus, in which the pads 412 on the active surface of the dices 410 is connected to the photo sensitive layer 30. Then, a layer of polymer material 700 is coated on the substrate 20 and the portion of dices 110. Next, the surface of layer of polymer material 700 is pressed to be planar by a molding apparatus 500. The polymer material 700 is filled between the dices 410 and encapsulated the dices 410 as shown in FIG. 14. The material of polymer material 700 is silicon, epoxy, acrylic or BCB.

Figure 15:
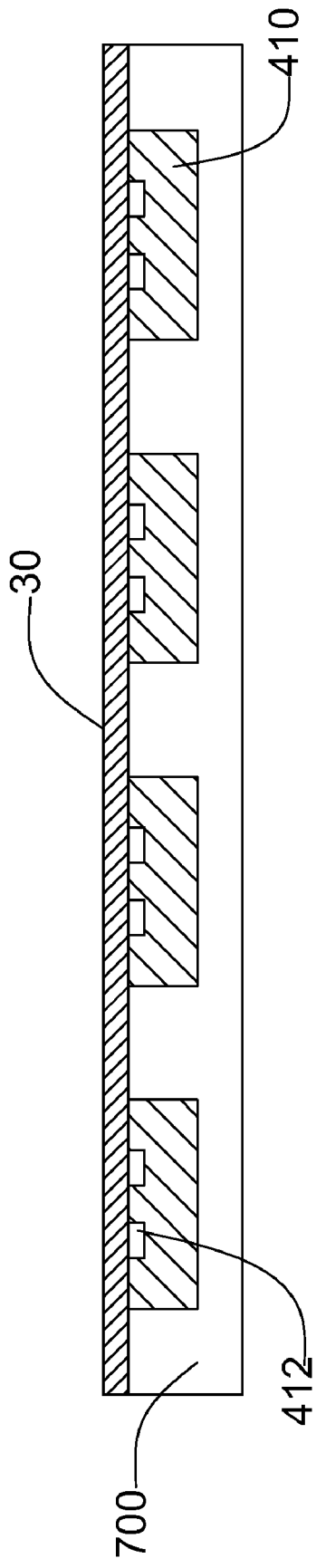

Next, the polymer material 700 is alternatively performed a baking process to cure the layer of polymer material 700. Then, the layer of polymer material 700 is separated from the molding apparatus 500 to expose the planar surface of the layer of polymer material 700. However, it is noted that the photo sensitive layer 30 is not cured by the baking process, thus, the substrate 20 can be separated from the photo sensitive layer 30 and the photo sensitive layer 30 is retained on the active surface of the dices 410 as shown in FIG. 15.

It is obviously, the five surfaces of each dices 410 is encapsulated by layer of polymer material 500, and the active surface of dices 410 is encapsulated by photo sensitive layer 30. Then, the reverse side of the cured layer of polymer material 500 is formed a plurality of sawing lines 414 by cutter (not shown in Figure), in which the depth of each sawing line is about 0.5 mil to 1 mil. Moreover, the width of sawing lines 414 is about 5 micrometers to 25 micrometers. In one preferred embodiment, the sawing lines 414 can be crisscross to be a reference line for cutting dices. Thus, the stress of the layer of polymer material 700 would be counterbalance by the area is made of sawing lines 414 when the photo sensitive layer 30 is separated from the layer of polymer material 700, thus, the warpage of the encapsulated body can be solved.

Figure 16:
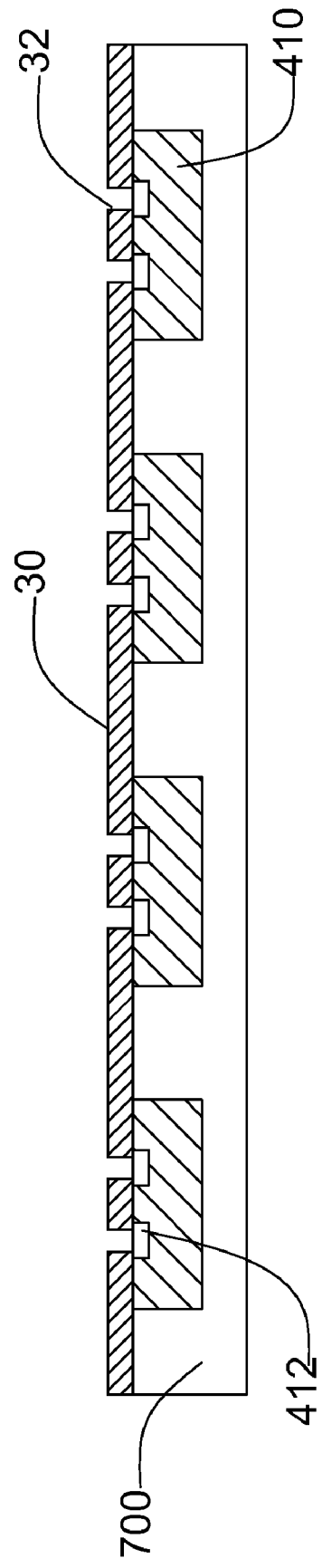
Figure 17:
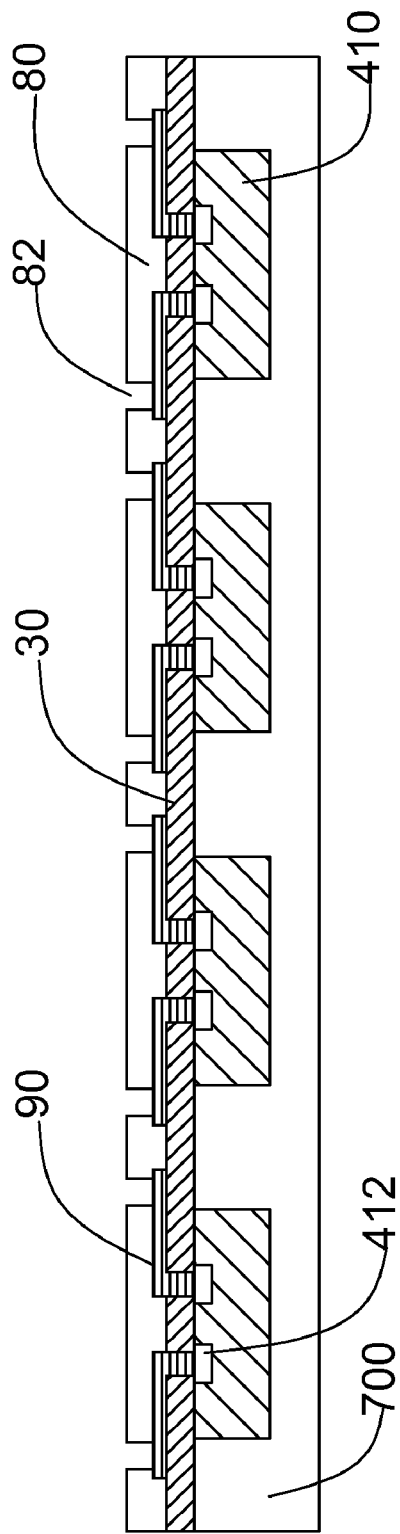
Figure 18:
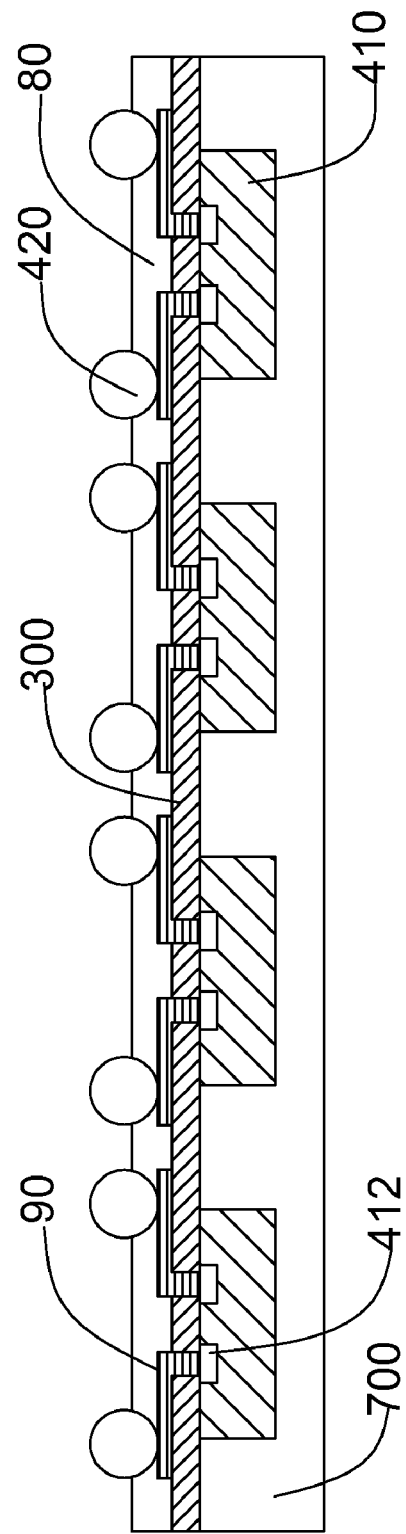

Due to the plurality of alignment mark 402 is formed on the reverse side of each dice 410, thus, the pads 412 of each dices 410 can be determined. Then, the plurality of openings 32 is formed on the photo sensitive layer 30 and to expose the pads 412 of each dices 410 as shown in FIG. 16. Then, the plurality of fan-out metal traces 90 is formed on the pads 412 of each dices 410 by redistribution layer process. Next, a protective layer 80 is formed on the metal traces 90 and a plurality of openings 82 is formed on the other ends of the metal traces 90 as shown in FIG. 17. Finally, the plurality of connecting components 420 is formed on each openings 82 that used as the connecting points for the dices 410, in which the connecting components 420 is metal bump or solder ball as shown in FIG. 18.

Then the layer of polymer material 700 is cut to form a plurality of dice with package body. It is obviously, the five surfaces of each dices 410 is encapsulated by the layer of polymer material 700, and the active surface of the dices 410 is encapsulated by photo sensitive layer 30 merely as shown in FIG. 19. Meanwhile, the metal traces 90 and the connecting components 420 can connect with the pads 412 of the dices 410 according to the alignment mark 402 so that the reliability of the dice 410 with the package body is increased.

Figure 11:
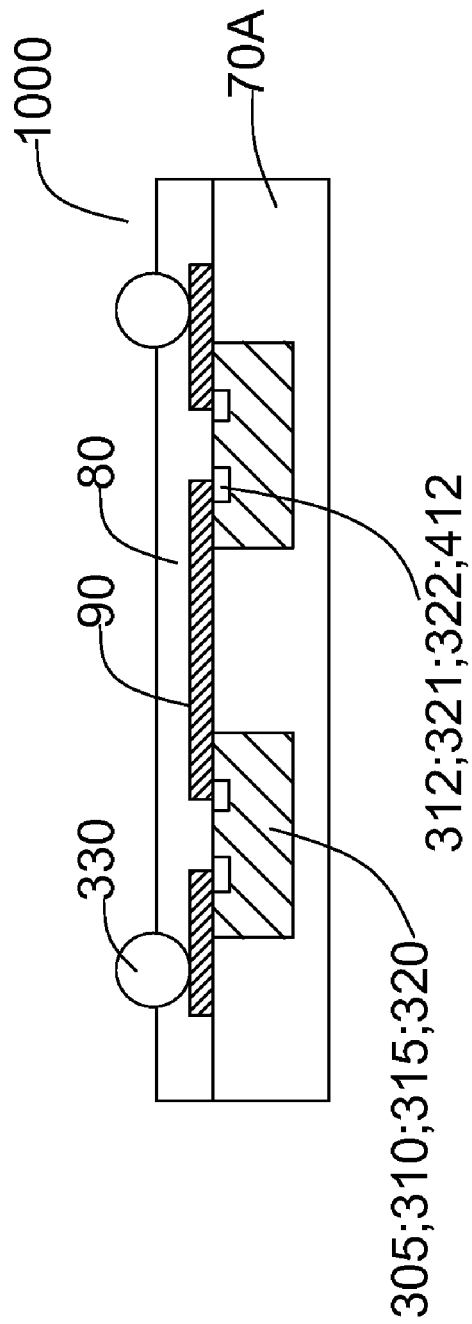

Similarly, the plurality of dices with same or different dimensions is applied for the above mentioned as shown in FIG. 8 or FIG. 9. Due to the package formation is same as the FIG. 10 to FIG. 12, thus, it would not be described herein, and the module with package body as shown in FIG. 20. It is obviously, the package structure of FIG. 20 includes a plurality of dices and each dices having a plurality of pads on the active surface and a bottom surface; then, the plurality of dices is encapsulated by encapsulated body and the active surface of dices is exposed; a photo sensitive layer is encapsulated the active surface of each dices and the pads is exposed; next, a protective layer is encapsulated the active surface of each dice and metal traces, and one ends of the metal traces is exposed; and the plurality of connecting components is electrically connected the other ends of the metal traces, the characteristic in that the encapsulated body is B-stage material. Of course, the heat dissipation 60 can be alternatively formed on the reverse side of the package body, and the formation of the heat dissipation is same as the above mentioned, thus, it would not describe herein.

What is claimed is:

1. A dice rearrangement package method, comprising:
providing a first substrate having a top surface and a bottom surface, and a layer of polymer material disposed on said top surface of said first substrate;
providing a plurality of dices, each said plurality of dices having an active surface and a reverse side, and a plurality of pads disposed on said active surface;
picking and placing each said plurality of dices disposed on said layer of polymer material;
providing a second substrate having a top surface and a bottom surface, and a layer of B-stage material is disposed on said top surface of said second substrate;
performing an assembling process for said second substrate and said layer of B-stage material connecting to said top surface of said first substrate, so that said layer of B-stage material is covered each said plurality of dices;
performing a baking process to make said layer of B-stage material to form a solidified encapsulated body;

separating said layer of polymer material and said first substrate from said solidified encapsulated body to expose said plurality of pads on said active surface of said plurality of dices;

forming a plurality of fan-out metal traces, each said plurality of fan-out metal traces is electrically connected to said plurality of pads;

forming a protecting layer to cover said active surface of each said plurality of dices and each said plurality of metal traces and one ends of each said plurality of metal traces being exposed;

forming a plurality of connecting components is electrically connected to another ends of each said plurality of metal traces; and cutting said encapsulated body to form a plurality of package structure independently.

2. The package method according to claim 1, wherein the material of said first substrate and said second substrate is selected from a group consisting of: glass, wafer, and metal material.

3. The package method according to claim 1, further comprising a pre-curing process to make said B-stage with viscosity.

4. The package method according to claim 1, wherein the reverse side of each said plurality of dice is disposed a plurality of alignment marks.

5. The package method according to claim 1, further comprising separating said second substrate after the step of separating said first substrate.

6. The package method according to claim 1, wherein said encapsulated body is provided for encapsulating a dice.

7. The package method according to claim 1, wherein said encapsulated body is provided for encapsulating a plurality of dices.

8. The package method according to claim 7, wherein said plurality of dices with same dimensions.

9. The package method according to claim 8, wherein said plurality of dices is light emitting device (LED).

10. The package method according to claim 8, wherein said plurality of dices is dynamic random access memory (DRAM).

11. The package method according to claim 7, wherein said plurality of dices with different dimensions.

12. The package method according to claim 11, wherein said plurality of dices with different dimension is selected from a group consisting of: microprocessor means, memory means, and memory controller means.

13. A dice rearrangement package method, comprising:
providing a first substrate having a top surface and a bottom surface, and said top surface is disposed a layer of sensitive material;
providing a plurality of dices, each said plurality of dices having an active surface and a reverse side, and a plurality of pads is disposed on said active surface;
picking and placing said plurality of dices, said active surface of each said plurality of dices is disposed on said layer sensitive material by flip chip technology;
providing a second substrate having a top surface and a bottom surface, and a B-stage material is on said top surface of said second substrate;
performing an assembling process for connecting said second substrate and said layer of B-stage material with said top surface of said first substrate and encapsulating each said plurality of dices;
performing a baking process to curing said layer of B-stage material to form a solidified encapsulated body;

separating said sensitive material from said encapsulated body to expose said plurality of pads on said active surface of said plurality of dices;

forming a plurality of fan-out metal traces, each said plurality of fan-out metal traces is electrically connected to said plurality of pads;

forming a protecting layer to cover said active surface of said plurality of dices and each said plurality of metal traces and one ends of each said plurality of fan-out metal traces is to be exposed;

forming a plurality of connecting components electrically connected to another ends of said plurality of fan-out metal traces; and cutting said encapsulated body to form a plurality of package structure independently.

14. The package method according to claim 13, wherein the material of said first substrate and said second substrate is selected from the group consisting of: glass, wafer, and metal material.

15. The package method according to claim 13, further comprising a pre-curing process to make said layer of B-stage material with viscosity.

16. The package method according to claim 13, wherein said reverse side of each said plurality of dices is disposed a plurality of alignment marks.

17. The package method according to claim 13, further comprising separating said second substrate after the step of separating said first substrate.

18. The package method according to claim 13, wherein said encapsulated body is provided for encapsulating a dice.

19. The package method according to claim 13, wherein said encapsulated body is encapsulating a plurality of dices.

20. The package method according to claim 19, wherein said plurality of dices with same dimension.

21. The package method according to claim 20, wherein said plurality of dices is light emitting device (LED).

22. The package method according to claim 20, wherein said plurality of dices is dynamic random access memory (DRAM).

23. The package method according to claim 19, wherein said plurality of dices with different dimension.

24. The package method according to claim 23, wherein said plurality of dices with different dimension is selected from a group consisting of: microprocessor means, memory means, and memory controller means.

25. A dice rearrangement package method, comprising:
providing a first substrate having a top surface and a second surface, and a sensitive material is on said top surface of first substrate;
providing a plurality of dices, each said plurality of dices having an active surface and a reverse side and a plurality of pads is disposed on said active surface;
picking and placing said plurality of dices, said active surface of each said plurality of dices is flip to form on said sensitive material;
providing a second substrate having a top surface and a bottom surface, and a layer of polymer material is on said top surface;
forming an encapsulated body to assembling said layer of polymer material, said second substrate and said top surface of said first substrate and so that said layer of polymer material is covered each said plurality of dices and full between each said plurality of dices;
separating said first substrate to expose said sensitive material and said encapsulated body;
forming a plurality of openings on said sensitive material and said plurality of pads of each said plurality of dices;

forming a plurality of fan-out metal traces to make one ends of said plurality of fan-out metal traces electrically connecting said plurality of pads;

forming a protecting layer to cover said active surface of each said plurality of dices and expose another ends of each said plurality of fan-out metal traces;

forming a plurality of connecting components electrically connecting another ends of said plurality of fan-out metal traces; and cutting an encapsulated body to form a plurality of encapsulated body independently.

26. The package method according to claim 25, wherein the material of first substrate and said second substrate is selected from the group consisting of: glass, wafer, and metal material.

27. The package method according to claim 25, wherein said reverse side of each said plurality of dices is disposed a plurality of alignment marks.

28. The package method according to claim 25, further comprising separating said second substrate after the step of separating said first substrate.

29. The package method according to claim 25, further comprising a baking process to solidify said layer of polymer material.

30. The package method according to claim 25, wherein said encapsulated body is provided for encapsulating a dice.

31. The package method according to claim 25, wherein said encapsulated body is provided for encapsulating a plurality of dices.

32. The package method according to claim 31, wherein said plurality of dices with same dimensions.

33. The package method according to claim 32, wherein said plurality of dices is light emitting device (LED).

34. The package method according to claim 31, wherein said plurality of dices is dynamic random access memory (DRAM).

35. The package method according to claim 31, wherein said plurality of dices with different dimensions.

36. The package method according to claim 35, wherein said plurality of dices with different dimension is selected from a group consisting of: microprocessor means, memory means, and memory controller means.

* * * * *